(12) United States Patent
Farjadrad et al.

(10) Patent No.: US 12,204,759 B1
(45) Date of Patent: *Jan. 21, 2025

(54) MULTI-CHIP MODULE (MCM) WITH MULTI-PORT UNIFIED MEMORY

(71) Applicant: Eliyan Corporation, Santa Clara, CA (US)

(72) Inventors: Ramin Farjadrad, Los Altos, CA (US); Syrus Ziai, Los Altos, CA (US)

(73) Assignee: Eliyan Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/380,932

(22) Filed: Oct. 17, 2023

Related U.S. Application Data

(63) Continuation of application No. 17/994,123, filed on Nov. 25, 2022, now Pat. No. 11,893,242.

(60) Provisional application No. 63/283,265, filed on Nov. 25, 2021.

(51) Int. Cl.
*G06F 3/06* (2006.01)

(52) U.S. Cl.
CPC .......... *G06F 3/0611* (2013.01); *G06F 3/0629* (2013.01); *G06F 3/0673* (2013.01)

(58) Field of Classification Search
CPC ..... G06F 3/0611; G06F 3/0629; G06F 3/0673
See application file for complete search history.

(56) References Cited

U.S. PATENT DOCUMENTS

| | | |
|---|---|---|
| 4,334,305 A | 6/1982 | Girardi |
| 5,396,581 A | 3/1995 | Mashiko |
| 5,677,569 A | 10/1997 | Choi |
| 5,892,287 A | 4/1999 | Hoffman |
| 5,910,010 A | 6/1999 | Nishizawa |
| 6,031,729 A | 2/2000 | Berkely |
| 6,055,235 A | 4/2000 | Blanc |
| 6,417,737 B1 | 7/2002 | Moloudi |
| 6,492,727 B2 | 12/2002 | Nishizawa |

(Continued)

OTHER PUBLICATIONS

Farjadrad et al., "A Bunch of Wires (BoW) Interface for Inter-Chiplet Communication", 2019 IEEE Symposium on High-Performance Interconnects (HOTI), pp. 27-30, Oct. 2019.

(Continued)

*Primary Examiner* — Zhuo H Li

(74) *Attorney, Agent, or Firm* — Lance Kreisman; Peninsula Patent Group

(57) ABSTRACT

Semiconductor devices, packaging architectures and associated methods are disclosed. In one embodiment, a multi-chip module (MCM) is disclosed. The MCM includes a common substrate and a first integrated circuit (IC) chip disposed on the common substrate. The first IC chip includes a first memory interface. A second IC chip is disposed on the common substrate and includes a second memory interface. A first memory device is disposed on the common substrate and includes memory and a first port coupled to the memory. The first port is configured for communicating with the first memory interface of the first IC chip. A second port is coupled to the memory and communicates with the second memory interface of the second IC chip. In-memory processing circuitry is coupled to the memory and controls transactions between the first memory device and the first and second IC chips.

21 Claims, 8 Drawing Sheets

(56) References Cited

U.S. PATENT DOCUMENTS

| | | |
|---|---|---|
| 6,690,742 B2 | 2/2004 | Chan |
| 6,721,313 B1 | 4/2004 | Van Duyne |
| 6,932,618 B1 | 8/2005 | Nelson |
| 7,027,529 B1 | 4/2006 | Ohishi |
| 7,248,890 B1 | 7/2007 | Raghavan |
| 7,269,212 B1 | 9/2007 | Chau |
| 7,477,615 B2 | 1/2009 | Oshita |
| 7,535,958 B2 | 5/2009 | Best |
| 7,593,271 B2 | 9/2009 | Ong |
| 7,701,957 B1 | 4/2010 | Bicknell |
| 7,907,469 B2 | 3/2011 | Sohn et al. |
| 7,978,754 B2 | 7/2011 | Yeung |
| 8,004,330 B1 | 8/2011 | Acimovic |
| 8,024,142 B1 | 9/2011 | Gagnon |
| 8,121,541 B2 | 2/2012 | Rofougaran |
| 8,176,238 B2 | 5/2012 | Yu et al. |
| 8,468,381 B2 | 6/2013 | Jones |
| 8,483,579 B2 | 7/2013 | Fukuda |
| 8,546,955 B1 | 10/2013 | Wu |
| 8,704,364 B2 | 4/2014 | Banijamali et al. |
| 8,861,573 B2 | 10/2014 | Chu |
| 8,948,203 B1 | 2/2015 | Nolan |
| 8,982,905 B2 | 3/2015 | Kamble |
| 9,088,334 B2 | 7/2015 | Chakraborty |
| 9,106,229 B1 | 8/2015 | Hutton |
| 9,129,935 B1 | 9/2015 | Chandrasekar |
| 9,294,313 B2 | 3/2016 | Prokop |
| 9,349,707 B1 | 5/2016 | Sun |
| 9,379,878 B1 | 6/2016 | Lugthart |
| 9,432,298 B1 | 8/2016 | Smith |
| 9,558,143 B2 | 1/2017 | Leidel |
| 9,832,006 B1 | 11/2017 | Bandi |
| 9,842,784 B2 | 12/2017 | Nasrullah |
| 9,843,538 B2 | 12/2017 | Woodruff |
| 9,886,275 B1 | 2/2018 | Carlson |
| 9,934,842 B2 | 4/2018 | Mozak |
| 9,961,812 B2 | 5/2018 | Suorsa |
| 9,977,731 B2 | 5/2018 | Pyeon |
| 10,171,115 B1 | 1/2019 | Shirinfar |
| 10,394,737 B1 | 8/2019 | Ngo |
| 10,402,363 B2 | 9/2019 | Long et al. |
| 10,410,694 B1 | 9/2019 | Arbel |
| 10,439,661 B1 | 10/2019 | Heydari |
| 10,642,767 B1 | 5/2020 | Farjadrad |
| 10,678,738 B2 | 6/2020 | Dai |
| 10,735,176 B1 | 8/2020 | Heydari |
| 10,769,073 B2 | 9/2020 | Desai |
| 10,803,548 B2 | 10/2020 | Matam et al. |
| 10,804,204 B2 | 10/2020 | Rubin et al. |
| 10,825,496 B2 | 11/2020 | Murphy |
| 10,826,536 B1 | 11/2020 | Beukema |
| 10,855,498 B1 | 12/2020 | Farjadrad |
| 10,935,593 B2 | 3/2021 | Goyal |
| 11,088,876 B1 * | 8/2021 | Farjadrad ............ H04L 25/0298 |
| 11,100,028 B1 | 8/2021 | Subramaniam |
| 11,164,817 B2 | 11/2021 | Rubin et al. |
| 11,204,863 B2 | 12/2021 | Sheffler |
| 11,581,282 B2 | 2/2023 | Elshirbini |
| 11,669,474 B1 | 6/2023 | Lee |
| 11,789,649 B2 | 10/2023 | Chatterjee et al. |
| 11,842,986 B1 * | 12/2023 | Ramin ................ H01L 25/0657 |
| 11,892,242 B2 | 2/2024 | Mao |
| 11,983,125 B2 | 5/2024 | Soni |
| 12,001,355 B1 | 6/2024 | Dreier |
| 2002/0122479 A1 | 9/2002 | Agazzi |
| 2002/0136315 A1 | 9/2002 | Chan |
| 2004/0088444 A1 | 5/2004 | Baumer |
| 2004/0113239 A1 | 6/2004 | Prokofiev |
| 2004/0130347 A1 | 7/2004 | Moll |
| 2004/0156461 A1 | 8/2004 | Agazzi |
| 2005/0041683 A1 | 2/2005 | Kizer |
| 2005/0134306 A1 | 6/2005 | Stojanovic |
| 2005/0157781 A1 | 7/2005 | Ho |
| 2005/0205983 A1 | 9/2005 | Origasa |
| 2006/0060376 A1 | 3/2006 | Yoon |
| 2006/0103011 A1 | 5/2006 | Andry |
| 2006/0158229 A1 | 7/2006 | Hsu |
| 2006/0181283 A1 | 8/2006 | Wajcer |
| 2006/0188043 A1 | 8/2006 | Zerbe |
| 2006/0250985 A1 | 11/2006 | Baumer |
| 2006/0251194 A1 | 11/2006 | Bublil |
| 2007/0281643 A1 | 12/2007 | Kawai |
| 2008/0063395 A1 | 3/2008 | Royle |
| 2008/0086282 A1 | 4/2008 | Artman |
| 2008/0143422 A1 | 6/2008 | Lalithambika |
| 2008/0186987 A1 | 8/2008 | Baumer |
| 2008/0222407 A1 | 9/2008 | Carpenter |
| 2009/0113158 A1 | 4/2009 | Schnell |
| 2009/0154365 A1 | 6/2009 | Diab |
| 2009/0174448 A1 | 7/2009 | Zabinski |
| 2009/0220240 A1 | 9/2009 | Abhari |
| 2009/0225900 A1 | 9/2009 | Yamaguchi |
| 2009/0304054 A1 | 12/2009 | Tonietto |
| 2010/0177841 A1 | 7/2010 | Yoon |
| 2010/0197231 A1 | 8/2010 | Kenington |
| 2010/0294547 A1 | 11/2010 | Hatanaka |
| 2011/0029803 A1 | 2/2011 | Redman-White |
| 2011/0038286 A1 | 2/2011 | Ta |
| 2011/0167297 A1 | 7/2011 | Su |
| 2011/0187430 A1 | 8/2011 | Tang |
| 2011/0204428 A1 | 8/2011 | Erickson |
| 2011/0267073 A1 | 11/2011 | Chengson |
| 2011/0293041 A1 | 12/2011 | Luo |
| 2012/0082194 A1 | 4/2012 | Tam |
| 2012/0182776 A1 | 7/2012 | Best |
| 2012/0192023 A1 | 7/2012 | Lee |
| 2012/0216084 A1 | 8/2012 | Chun |
| 2012/0327818 A1 | 12/2012 | Takatori |
| 2013/0181257 A1 | 7/2013 | Ngai |
| 2013/0222026 A1 | 8/2013 | Havens |
| 2013/0249290 A1 | 9/2013 | Buonpane |
| 2013/0285584 A1 | 10/2013 | Kim |
| 2014/0016524 A1 | 1/2014 | Choi |
| 2014/0048947 A1 | 2/2014 | Lee |
| 2014/0126613 A1 | 5/2014 | Zhang |
| 2014/0192583 A1 | 7/2014 | Rajan |
| 2014/0269860 A1 | 9/2014 | Brown |
| 2014/0269983 A1 | 9/2014 | Baeckler |
| 2015/0012677 A1 | 1/2015 | Nagarajan |
| 2015/0046612 A1 | 2/2015 | Gupta |
| 2015/0172040 A1 | 6/2015 | Pelekhaty |
| 2015/0180760 A1 | 6/2015 | Rickard |
| 2015/0206867 A1 | 7/2015 | Lim |
| 2015/0271074 A1 | 9/2015 | Hirth |
| 2015/0326348 A1 | 11/2015 | Shen |
| 2015/0358005 A1 | 12/2015 | Chen |
| 2016/0056125 A1 | 2/2016 | Pan |
| 2016/0071818 A1 | 3/2016 | Wang |
| 2016/0111406 A1 | 4/2016 | Mak |
| 2016/0217872 A1 | 7/2016 | Hossain |
| 2016/0294585 A1 | 10/2016 | Rahman |
| 2017/0255575 A1 | 9/2017 | Niu |
| 2017/0317859 A1 | 11/2017 | Hormati |
| 2017/0331651 A1 | 11/2017 | Suzuki |
| 2018/0010329 A1 | 1/2018 | Golding, Jr. |
| 2018/0082981 A1 | 3/2018 | Gowda |
| 2018/0137005 A1 | 5/2018 | Wu |
| 2018/0175001 A1 | 6/2018 | Pyo |
| 2018/0190635 A1 | 7/2018 | Choi |
| 2018/0210830 A1 | 7/2018 | Malladi et al. |
| 2018/0315735 A1 | 11/2018 | Delacruz |
| 2019/0044764 A1 | 2/2019 | Hollis |
| 2019/0058457 A1 | 2/2019 | Ran |
| 2019/0108111 A1 | 4/2019 | Levin |
| 2019/0198489 A1 | 6/2019 | Kim |
| 2019/0319626 A1 | 10/2019 | Dabral |
| 2020/0051961 A1 | 2/2020 | Rickard |
| 2020/0105718 A1 | 4/2020 | Collins et al. |
| 2020/0257619 A1 | 8/2020 | Sheffler |
| 2020/0373286 A1 | 11/2020 | Dennis |
| 2021/0056058 A1 | 2/2021 | Lee |
| 2021/0082875 A1 | 3/2021 | Nelson |
| 2021/0117102 A1 | 4/2021 | Grenier |
| 2021/0149763 A1 | 5/2021 | Ranganathan |

(56) References Cited

U.S. PATENT DOCUMENTS

| | | |
|---|---|---|
| 2021/0181974 A1 | 6/2021 | Ghosh |
| 2021/0183842 A1 | 6/2021 | Fay |
| 2021/0193567 A1 | 6/2021 | Cheah et al. |
| 2021/0258078 A1 | 8/2021 | Meade |
| 2021/0311900 A1 | 10/2021 | Malladi |
| 2021/0365203 A1 | 11/2021 | O |
| 2022/0051989 A1 | 2/2022 | Agarwal |
| 2022/0121381 A1 | 4/2022 | Brewer |
| 2022/0159860 A1 | 5/2022 | Winzer |
| 2022/0179792 A1 | 6/2022 | Banerjee |
| 2022/0189934 A1 | 6/2022 | Kim |
| 2022/0222198 A1 | 7/2022 | Lanka |
| 2022/0223522 A1 | 7/2022 | Scearce |
| 2022/0237138 A1 | 7/2022 | Lanka |
| 2022/0254390 A1 | 8/2022 | Gans |
| 2022/0327276 A1 | 10/2022 | Seshan |
| 2022/0334995 A1 | 10/2022 | Das Sharma |
| 2022/0342840 A1 | 10/2022 | Das Sharma |
| 2023/0039033 A1 | 2/2023 | Zarkovsky |
| 2023/0068802 A1 | 3/2023 | Wang |
| 2023/0090061 A1 | 3/2023 | Zarkovsky |
| 2023/0092541 A1 | 3/2023 | Dugast |
| 2023/0161599 A1 | 5/2023 | Erickson |
| 2023/0289311 A1* | 9/2023 | Noguera Serra ... G06F 15/7825 |
| 2023/0359579 A1 | 11/2023 | Madhira |
| 2024/0273041 A1 | 8/2024 | Lee |

OTHER PUBLICATIONS

Universal Chiplet Interconnect Express (UCIe) Specification Rev. 1.0, Feb. 24, 2022.

Brinda Ganesh et. al., "Fully-Buffered DIMM Memory Architectures: Understanding Mechanisms, Overheads and Scaling", 2007, IEEE, 2007 IEEE 13th International Symposium on High Performance Computer Architecture, pp. 1-12 (Year: 2007).

Anu Ramamurthy, "Chiplet Technology & Heterogeneous Integration" Jun. 2021, NASA, 2021 NEPP ETW, slides 1-17 (Year: 2021).

Wikipedia, "Printed circuit board", Nov. 9, 2021, Wayback Machine, as preserved by the Internet Archive on Nov. 9, 2021, pp. 1-23 (Year: 2021).

Block Memory Generator v8.2 LogiCORE IP Product Guide Vivado Design Suite; Xilinx; Apr. 1, 2015.

Kurt Lender et al., "Questions from the Compute Express Link Exploring Coherent Memory and Innovative Cases Webinar", Apr. 13, 2020, CXL consortium.

Planet Analog, "The basics of SerDes (serializers/deserializers) for interfacing", Dec. 1, 2020, Planet Analog.

U.S. Appl. No. 16/812,234; Mohsen F. Rad; Filed Mar. 6, 2020.

"Hot Chips 2017: Intel Deep Dives Into EMIB", TomsHardware.com; Aug. 25, 2017.

"Using Chiplet Encapsulation Technology to Achieve Processing-In-Memory Functions"; Micromachines 2022, 13, 1790; https://www.mdpi.com/journal/micromachines; Tian et al.

"Multiport memory for high-speed interprocessor communication in MultiCom;" Scientia Iranica, vol. 8, No. 4, pp. 322-331; Sharif University of Technology, Oct. 2001; Asgari et al.

Universal Chiplet Interconnect Express (UCIe) Specification, Revision 1.1, Version 1.0, Jul. 10, 2023.

Hybrid Memory Cube Specification 2.1, Hybrid Memory Cube Consortium, HMC-30G-VSR Phy, 2014.

"Using Dual Port Memory as Interconnect", EE Times, Apr. 26, 2005, Daniel Barry.

Quartus II Handbook Version 9.0 vol. 4: SOPC Builder; "System Interconnect Fabric for Memory-Mapped Interfaces"; Mar. 2009.

* cited by examiner

MULTI-CHIP MODULE (MCM) WITH MULTI-PORT UNIFIED MEMORY

CROSS-REFERENCE TO RELATED APPLICATIONS

This application is a Continuation of U.S. patent application Ser. No. 17/994,123, filed Nov. 25, 2022 entitled MULTI-CHIP MODULE (MCM) WITH MULTI-PORT UNIFIED MEMORY, which a Non-Provisional that claims priority to U.S. Provisional Application No. 63/283,265, filed Nov. 25, 2021, entitled ENABLING ADVANCE SYSTEM-IN-PACKAGE ARCHITECTURES AT LOW-COST USING HIGH-BANDWIDTH ULTRA-SHORT-REACH (USR) CONNECTIVITY IN MCM PACKAGES, which is incorporated herein by reference in its entirety.

TECHNICAL FIELD

The disclosure herein relates to semiconductor devices, packaging and associated methods.

BACKGROUND

As integrated circuit (IC) chips such as system on chips (SoCs) become larger, the yields realized in manufacturing the chips become smaller. Decreasing yields for larger chips increases overall costs for chip manufacturers. To address the yield problem, chiplet architectures have been proposed that favor a modular approach to SoCs. The solution employs smaller sub-processing chips, each containing a well-defined subset of functionality. Chiplets thus allow for dividing a complex design, such as a high-end processor or networking chip, into several small die instead of one large monolithic die.

When accessing memory, traditional chiplet architectures often provide for a given chip accessing data from a dedicated memory space, processing the data, then returning the data back to the memory space, or sending the processed data to a different memory space for access by a second chip. In some situations, this may result in considerable latency or delay in fully processing the data by the multiple chips.

BRIEF DESCRIPTION OF THE DRAWINGS

Embodiments of the disclosure are illustrated by way of example, and not by way of limitation, in the figures of the accompanying drawings and in which like reference numerals refer to similar elements and in which.

DETAILED DESCRIPTION

Semiconductor devices, packaging architectures and associated methods are disclosed. In one embodiment, a multi-chip module (MCM) is disclosed. The MCM includes a common substrate and a first integrated circuit (IC) chip disposed on the common substrate. The first IC chip includes a first memory interface. A second IC chip is disposed on the common substrate and includes a second memory interface. A first memory device is disposed on the common substrate and includes memory and a first port coupled to the memory. The first port is configured for communicating with the first memory interface of the first IC chip. A second port is coupled to the memory and communicates with the second memory interface of the second IC chip. In-memory processing circuitry is coupled to the memory and controls transactions between the first memory device and the first and second IC chips. By including the in-memory processing circuitry on the memory device, controlled accesses to the memory for operations associated with the first IC chip and the second IC chip may be carried out with lower latency and lower cost. For some embodiments, the in-memory processing circuitry takes the form of a co-processor or accelerator that is capable of carrying out a processing function that is off-loaded from the first IC chip or second IC chip on data retrieved from the memory. In other embodiments, the in-memory processing circuitry may include network-on-chip (NoC) circuitry to control the transactions between the memory and the first IC chip and the second IC chip.

Figure 1:
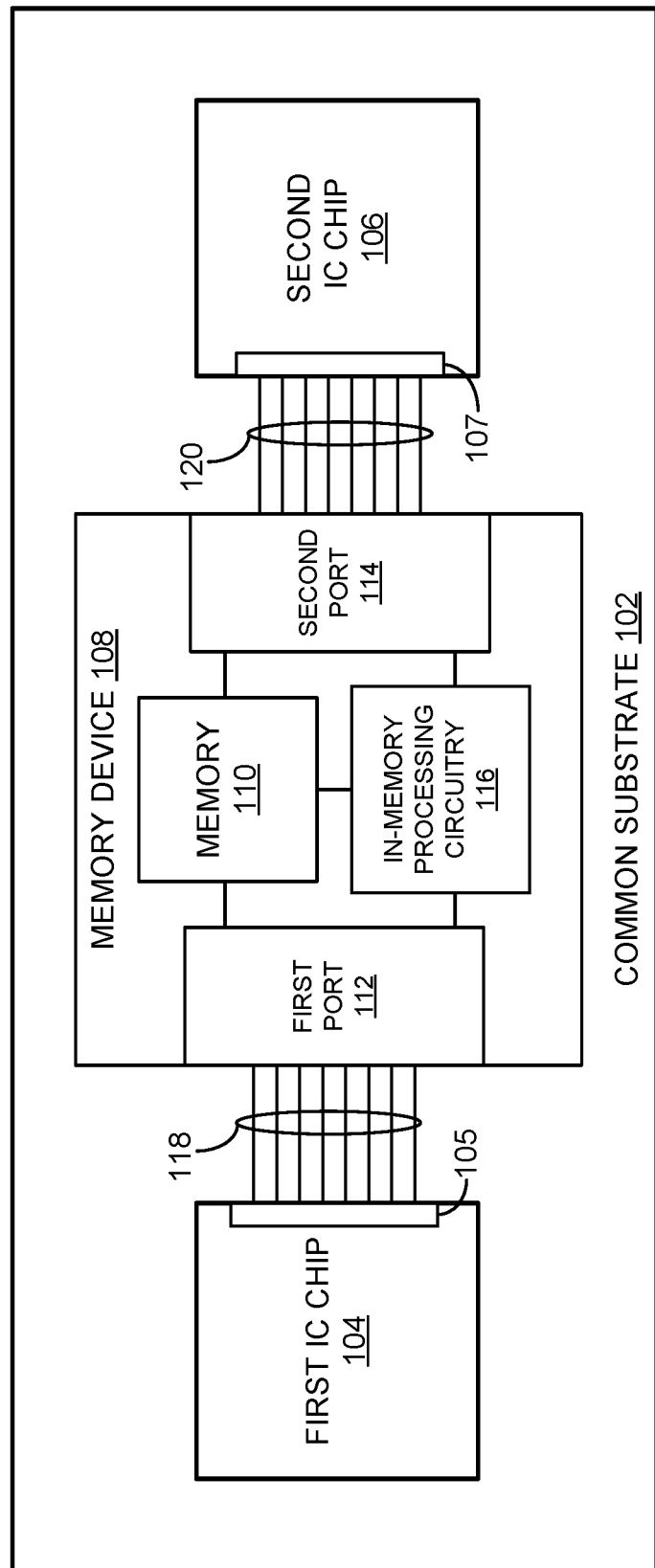
FIG. 1 illustrates a high-level embodiment of a multi-chip module (MCM), including a memory device that is interconnected to two IC chips.

Throughout the disclosure provided herein, the term multi-chip module (MCM) is used to represent a semiconductor device that incorporates multiple semiconductor die or sub-packages in a single unitary package. An MCM may also be referred to as a system in a chip (SiP). With reference to FIG. 1, a multi-chip module (MCM) is shown, generally designated 100. For one embodiment, the MCM includes a substrate 102 that serves as a common substrate for a first integrated circuit (IC) chip 104, a second IC chip 106 and a memory device 108. For some embodiments, the various chips are interconnected in a manner that allows for use of a relatively inexpensive non-silicon or organic substrate as the common substrate. The use of a non-silicon common substrate 102 avoids size and signaling constraints typically associated with silicon-based substrates. This allows the substrate 102 to be larger, incorporate a more relaxed bump pitch for external interface contacts, and provide low-loss traces.

With continued reference to FIG. 1, the first IC chip 104 is mounted to the common substrate 102 and may take the form of a computer processing unit (CPU), graphics processing unit (GPU), artificial intelligence (AI) processing circuitry or the like. For one embodiment, the first IC chip 104 includes first interface circuitry 105 for communicating with the memory device 108. For one embodiment, the first interface circuitry 105 supports transactions with the first memory device 108 via a high-speed link 118. Various embodiments for compatible interface schemes are disclosed in U.S. patent application Ser. No. 17/973,905, titled "Method and Apparatus to Reduce Complexity and Cost For Multi-Chip Modules (MCMs)", filed Oct. 26, 2022, incorporated by reference in its entirety, and assigned to the assignee of the instant application. The second IC chip 106 may be formed similar to the first IC chip 104, including second interface circuitry 107 for communicating with the memory device 108. Like the first IC chip 104, the second IC chip 106 may take the form of a computer processing unit (CPU), graphics processing unit (GPU), artificial intelligence (AI) processing circuitry or the like.

With continued reference to FIG. 1, one embodiment of the memory device 108 includes a first port 112 for interfacing with the first IC chip 104 via the first high-speed link 118, and a second port 114 for interfacing with the second IC chip 106 via a second link 120. Memory 110 is coupled to the first port 112 and the second port 114 and is configured with a unified memory space that, for one embodiment, is fully accessible to each of the first and second ports 112 and 114. While only two ports are shown for clarity, for some embodiments, three or more ports may be employed, corresponding to the edges of a standard IC chip and the available edge space for the interface circuitry.

Further referring to FIG. 1, in-memory processing circuitry 116 provides processing resources in the memory device 108 to provide a variety of functions. For some embodiments, described more fully below, the in-memory processing circuitry 116 may take the form of a co-processor or accelerator that carries out functions offloaded from the first IC chip 104 or the second IC chip 106. In other embodiments, the in-memory processing circuitry 116 may instead (or additionally) include a router functionality in the form of network-on-chip (NoC) circuitry for controlling access between the memory device 108 and the first and second IC chips 104 and 106, and, in some embodiments, controlling forwarding and receiving operations involving other IC chips (not shown) that may be disposed on the MCM 100. Further detail regarding embodiments of the NoC circuitry are provided below.

Figure 2:
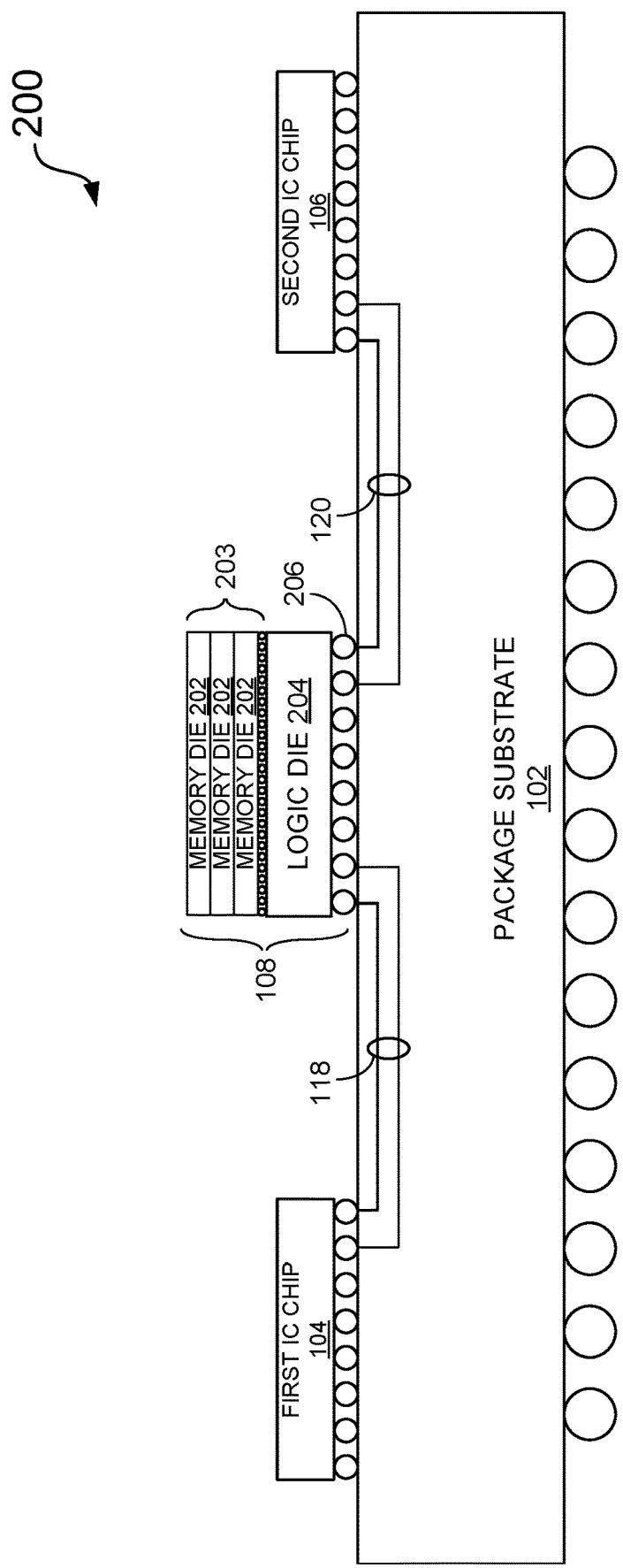
FIG. 2 illustrates a cross-sectional view of one embodiment of the MCM of FIG. 1.

FIG. 2 illustrates a cross-sectional view of one embodiment of the MCM 100 of FIG. 1 that employs one specific embodiment of the memory device 108. As shown, for one embodiment, the memory device 108 may be configured as a 3-dimensional (3D) packaging architecture with one or more memory die 202 stacked and assembled as a sub-package 203 that is vertically stacked with a logic base die 204. For some embodiments, the logic base die 204 is configured as an interface die for the stack of memory die 203 and may be compatible with various dynamic random access memory (DRAM) standards, such as high-bandwidth memory (HBM), or non-volatile memory standards such as Flash memory. The stack of memory die 203 and the logic base die 204 may be packaged together as a sub-package to define the memory device 108, with the logic base die 204 further formed with an external interface in the form of an array of contact bumps, at 206. Various alternative 3D embodiments for the memory device are disclosed in the above-referenced U.S. patent application Ser. No. 17/973,905. Additionally, while shown as a 3D stacked architecture, the memory device 108 may alternatively take the form of a 2.5D architecture, where the various die are positioned in a horizontal relationship. Such architectures are also described in U.S. patent application Ser. No. 17/973,905.

Figure 3:
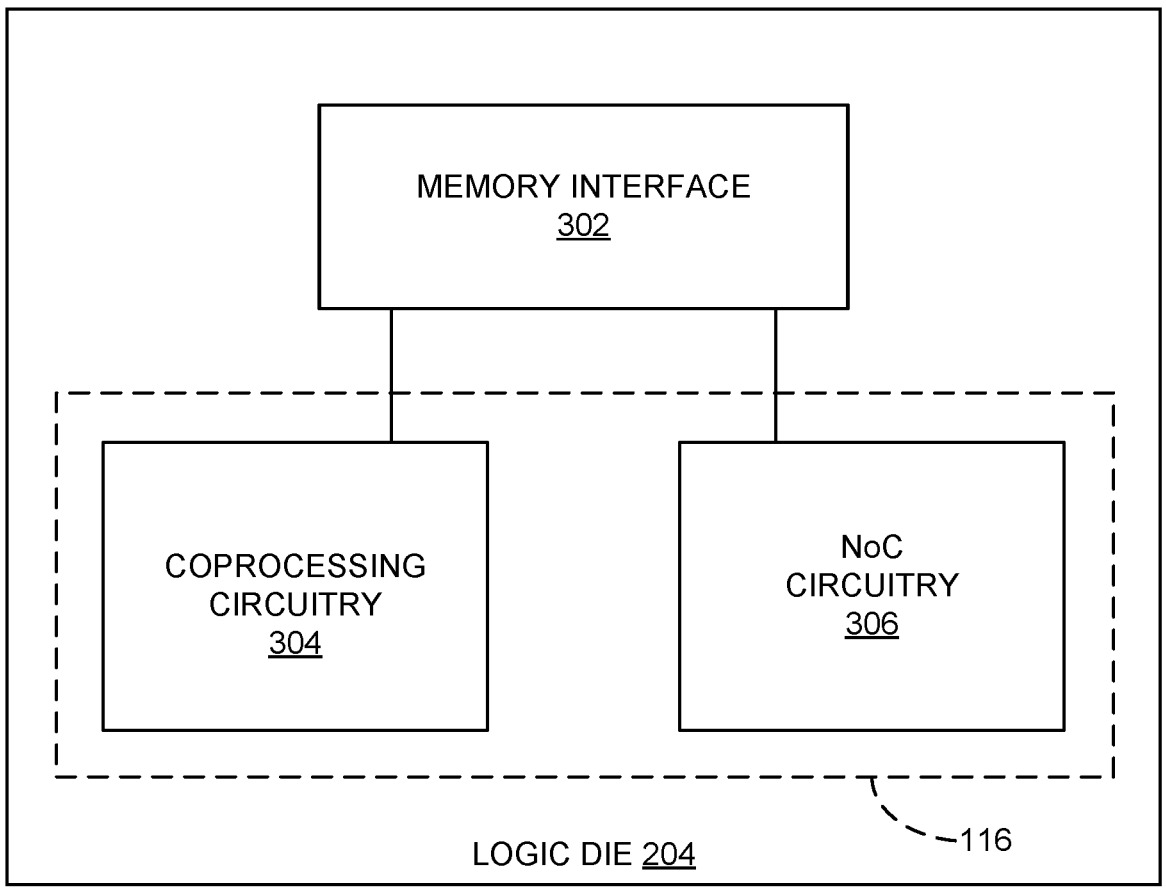
FIG. 3 illustrates a block diagram of one embodiment of a logic die incorporated into a memory device of the MCM of FIG. 2.

Referring now to FIG. 3, for one embodiment, the logic base die 204 incorporated in the memory device 108 is manufactured in accordance with a logic process that incorporates node feature sizes similar to those of the first IC chip and the second IC chip, but with a much smaller overall size and footprint. As a result, operations carried out by the logic base die 204 may be more power efficient than those carried out by the larger IC chips 104 and 106. In some embodiments, the logic base die 204 includes memory interface circuitry 302 that defines the first and second ports 112 and 114 (FIG. 1), allowing the first and second IC chips 104 and 106 to access the entirety of the memory space of the memory 110. For one embodiment, the first and second ports 112 and 114 take the form of spatial signaling path resources that access the memory via multiplexer or switch circuitry, such that either IC chip has access to any portion of the memory during a given time interval. In this manner, where both of the first and second IC chips share the entirety of the memory 110, the memory device 108 becomes unified, thereby avoiding many of the latency problems associated with separately disposed memory spaces dedicated to separate IC chips.

Further referring to FIG. 3, for one embodiment, the logic base die 204 realizes at least a portion of the in-memory processing circuitry 116 as co-processing circuitry 304. The co-processing circuitry 304 provides co-processor or accelerator resources in the memory device 108 to allow for off-loading of one or more CPU/GPU/AI processing tasks involving data retrieved from the memory 110 without the need to transfer the data to either of the first or second IC chips 104 or 106. For example, in some embodiments, the co-processing circuitry 304 may be optimized to perform straightforward multiply-accumulate operations on data retrieved from the memory 110, thus avoiding the need for the larger and more power-hungry IC chips 104 or 106 to perform the same operations. The co-processing circuitry 304 may be accessed by providing application programming interfaces (APIs) in software frameworks (such as, for example, Pytorch, Spark, Tensorflow) in a manner that avoids re-writing application software. By carrying out offloaded processing tasks in this manner, data transfer latencies may be reduced, while power efficiency associated with the processing tasks may be increased.

For some embodiments, and with continued reference to FIG. 3, the logic base die 204 also provides network-on-chip (NoC) circuitry 306 for the memory device 108. The NoC circuitry 306 generally serves as a form of network router or switch for cooperating with other NoC circuits that may be disposed in various other IC chips or memory devices disposed on the MCM 100. Thus, the NoC circuitry 306 is generally capable of transferring and/or receiving data and/or control signals via a packet-switched protocol to any other nodes within the MCM 100 that also have NoC circuitry.

Figure 4:
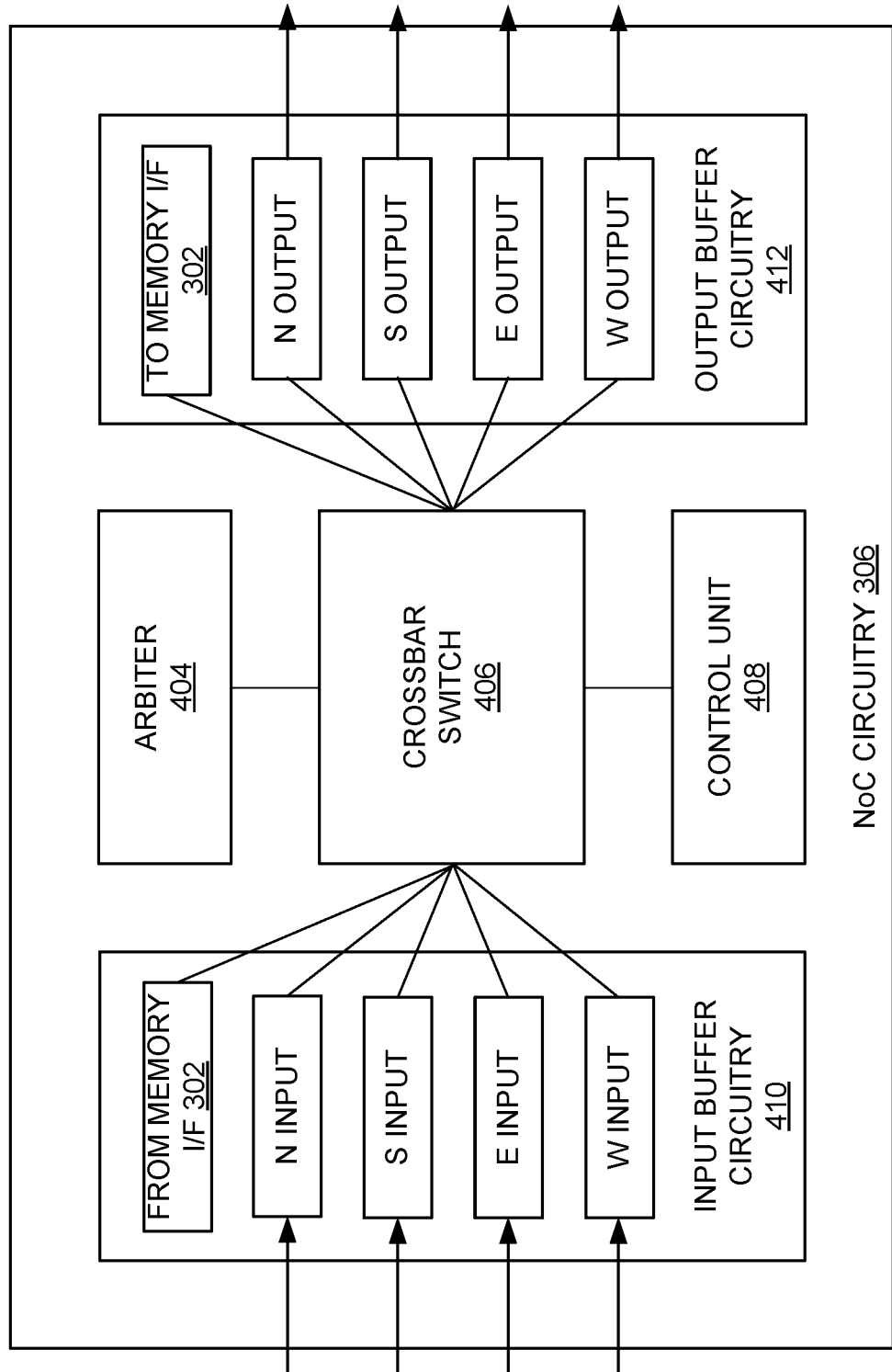
FIG. 4 illustrates one embodiment of the network on chip (NoC) circuitry of FIG. 3.

FIG. 4 illustrates one specific embodiment of the NoC circuitry 306 of FIG. 3. The NoC circuitry 306 includes input buffer circuitry 410 that receives data and/or control signals from a separate NoC circuit associated with another IC chip or node on the MCM 100. Depending on how many separate edge interfaces, or ports, are employed by the memory device 108, the input buffer circuitry 410 may include two (corresponding to, for example, "east" and "west" ports such as those shown in FIG. 1), three, or four queues ("N INPUT", "S INPUT", "E INPUT" OR "W INPUT") to temporarily store signals received from the multiple ports. The memory interface 302 of the memory device 108 may also provide input data/control signals for transfer by the NoC circuitry 306 to another NoC node in the MCM 100.

Further referring to FIG. 4, the input buffer circuitry 410 feeds a crossbar switch 406 that is controlled by a control unit 408 in cooperation with a scheduler or arbiter 404. Output buffer circuitry 412 couples to the crossbar switch 406 to receive data/control signals from the memory device 108 or the data/control signals from the input buffer circuitry 410 for transfer to a selected output port/interface ("N OUTPUT", "S OUTPUT", "E OUTPUT" OR "W OUTPUT"). The crossbar switch 406 may also feed any of the signals from the input buffer circuitry 410 to the memory interface 302 of the memory device 108.

Figure 5:
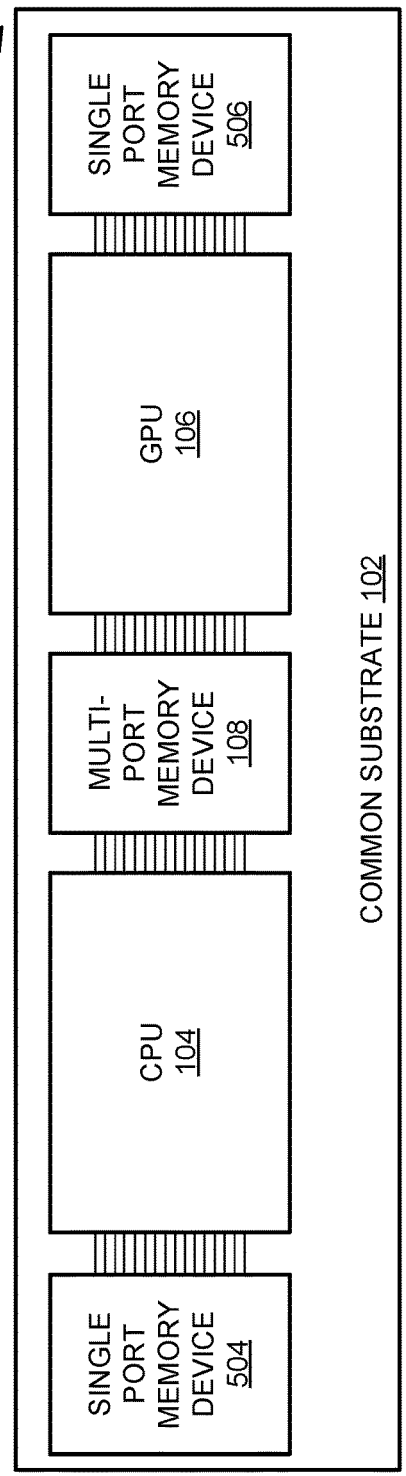
FIG. 5 illustrates one embodiment of an interconnection topology for an MCM architecture that is similar to the MCM of FIG. 1.

FIG. 5 illustrates a chip topology on an MCM, generally designated 500, that is similar to the architecture of FIG. 1, including a CPU as the first IC chip 104, a GPU as the second IC chip 106, and an HBM/NOC memory device as the first memory device 108. The MCM 500 also includes additional memory devices 504 and 506 that are configured as single-port memory devices and are disposed on the common substrate 102 in a distributed manner.

Figure 6:
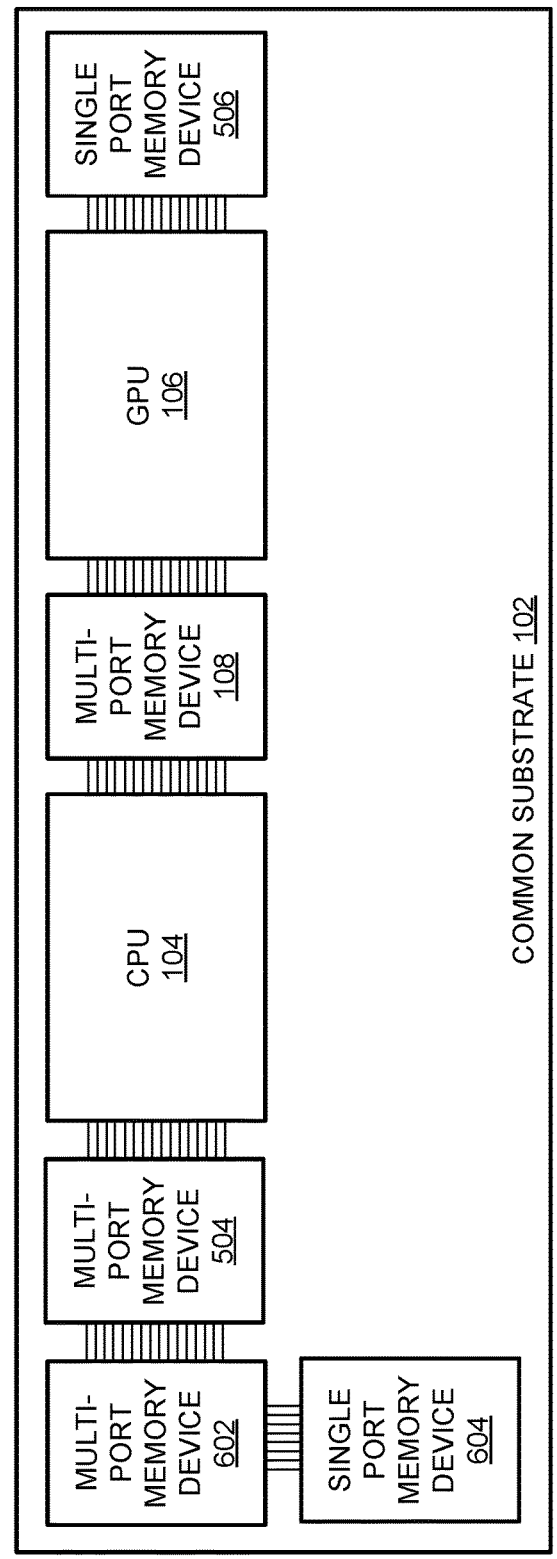
FIG. 6 illustrates a further interconnection topology similar to that of FIG. 5.

FIG. 6 illustrates an additional architecture that incorporates the topology of FIG. 5, and also includes further memory devices 602 and 604 coupled to the memory device 504. For one embodiment, the additional memory devices 602 and 604 provide additional memory capacity for the first IC chip 104 without the need for additional corresponding I/O interface circuitry at the edge of the first IC chip 104. The first IC chip 104 thus may access memory device 602 via the first and second ports of memory device 504. Accessing memory device 604 by the first IC chip 104 is performed similarly via the first and second ports of memory device 504 and 602. The connection of additional memory devices 602 and 604 through memory device 504 to the first IC chip 104 can be purely for extending the total memory to the first IC chip 104, and such memory extension does not necessarily need a NOC to connect them to other chips in the package. In some embodiments, the interconnected memory devices 504, 602 and 604 may, for example, provide different memory hierarchies for the first IC chip 104. As a result, for the first IC chip 104, the memory device 504 may serve as low-latency memory (such as cache memory) for data accessed more often with minimal latency, while the second and third memory devices 602 and 604 may serve as backing store media and/or other forms of storage where additional latency may be tolerated. Further, the addition of the memory devices 602 and 604 has little to no electrical impact on the MCM due to the buffering nature of the memory device 504 (where the aggregate load of the memory devices 504, 602 and 604 is seen as a single load from the perspective of the first IC chip 104). As a result, system software memory management tasks may be simplified as memory capacity is added to the MCM. Use of the unified memory architecture described above for each memory device contributes to a lower cost of use since the unified architecture is able to provide a variety of storage functions for a myriad of applications.

Figure 7:
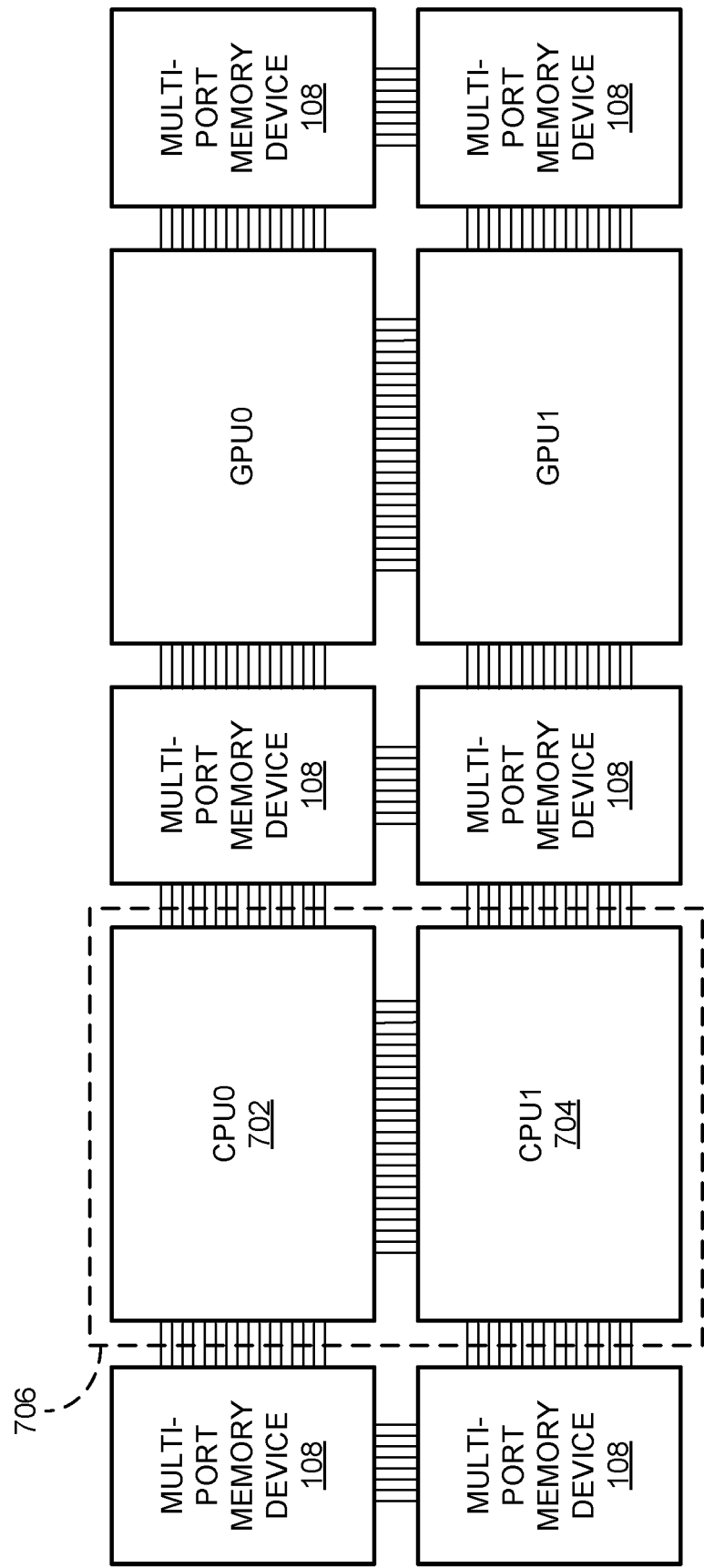
FIG. 7 illustrates another interconnection topology similar to that of FIG. 5.

FIG. 7 illustrates yet another topology that is similar to the MCM of FIG. 5, but further scales the architecture to include a further disaggregated second level of processing and memory resources that are straightforwardly interconnected. Such a topology enables complex application specific integrated circuit (ASIC) chips to be partitioned into smaller interconnected chiplets, such as at 702 and 704, that together form a virtual ASIC 706. Having the smaller processing chiplets 702 and 704 virtualized in this manner allows for beneficial pairing and sized matching of memory device chiplet packages 708 to the smaller processing chiplets. Moreover, for embodiments where each memory device and processor chip includes NoC circuitry, any of the IC chips and memory devices of the MCM of FIG. 7 may communicate with any other of the IC chips and memory devices.

Figure 8:
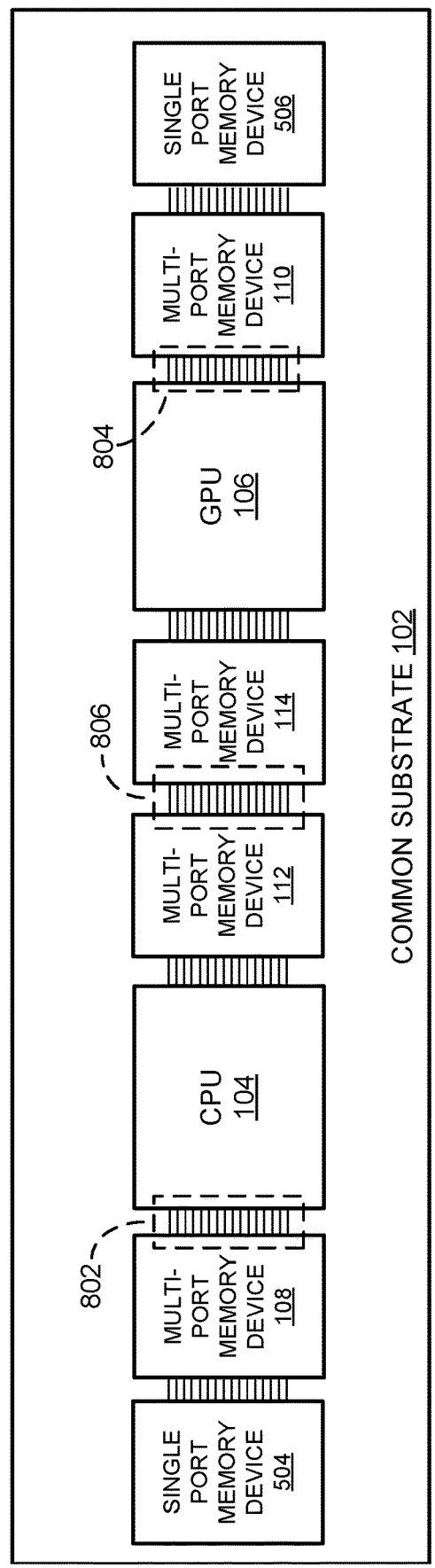
FIG. 8 illustrates a further interconnection topology similar to that of FIG. 5.
Figure 9:
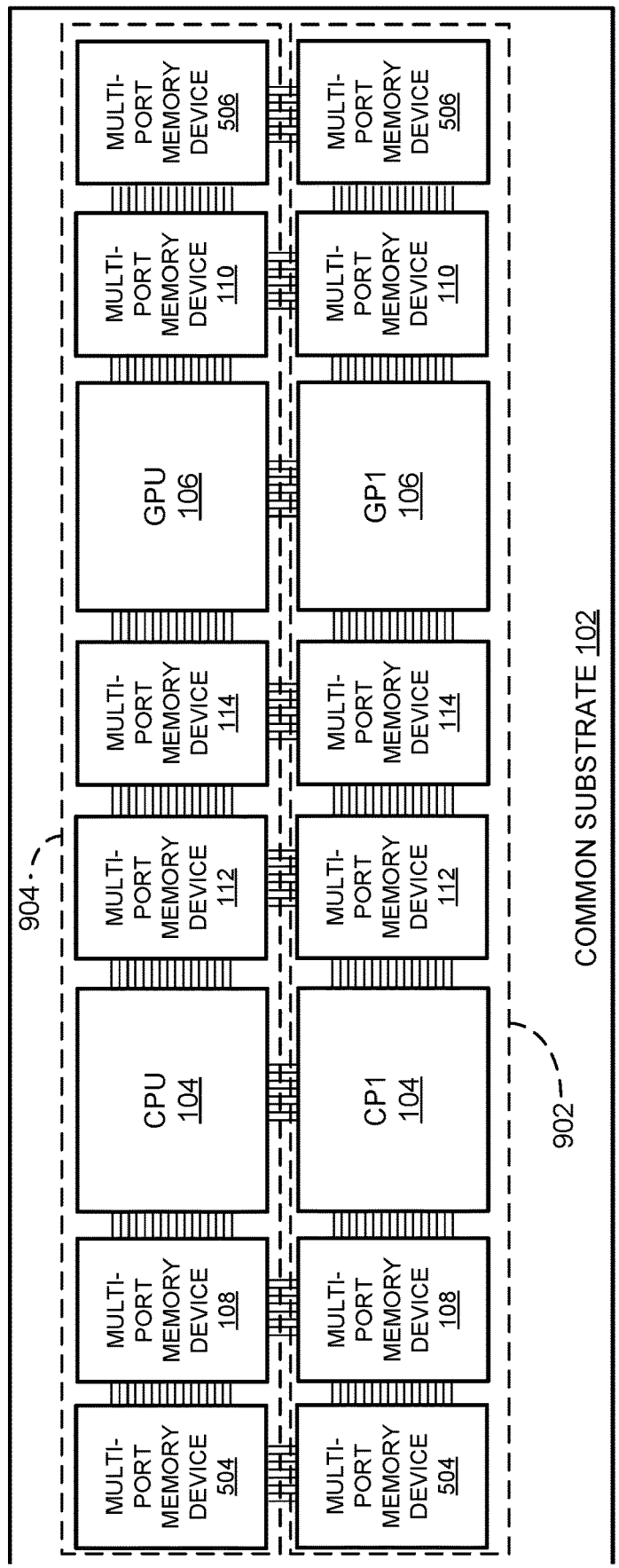
FIG. 9 illustrates another interconnection topology similar to that of FIG. 8.

FIG. 8 illustrates one embodiment of an MCM 800 that is similar to the architecture of FIG. 6, with a CPU resource 104 coupled to a pair of inline memory devices 108 and 504 via a single link 802. This allows for memory capacity upgrades without requiring additional physical I/O space (multiple interfaces for coupling to multiple links) along the edge of the CPU 104. By adding an additional single-port memory device 504 and coupling it to the multi-port memory device 108, accesses to the added memory device 504 may be made by the CPU 104 via the in-memory processing circuitry, such as the NoC circuitry, that is disposed in the multi-port memory device 108. A similar configuration is shown at the far right of the MCM 800 with memory devices 110 and 506 that are in communication with a GPU 106 via a second link 804. FIG. 8 also shows a pair of multi-port memory devices 112 and 114 that are interconnected by a simultaneous bidirectional link, at 806. The simultaneous bidirectional link 806 allows for concurrent accesses to a given distal memory device by the CPU 104 (where it accesses memory device 114 via memory device 112) and the GPU 106 (where it accesses memory device 112 via memory device 114). Having the ability to perform concurrent accesses significantly increases the bandwidth of the system. As an example of scaling the architecture of FIG. 8 even larger, FIG. 9 illustrates an MCM 900 that adds a second row of devices, at 902, that interconnect to a first row of devices, at 904, essentially doubling the resources provided in the architecture of FIG. 8. Additional rows of devices may also be employed to scale the capacity even further, if desired.

When received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

In the foregoing description and in the accompanying drawings, specific terminology and drawing symbols have been set forth to provide a thorough understanding of the present disclosure. In some instances, the terminology and symbols may imply specific details that are not required to practice embodiments of the disclosure. For example, any of the specific numbers of bits, signal path widths, signaling or operating frequencies, component circuits or devices and the like may be different from those described above in alternative embodiments. Also, the interconnection between circuit elements or circuit blocks shown or described as multi-conductor signal links may alternatively be single-conductor signal links, and single conductor signal links may alternatively be multi-conductor signal links. Signals and signaling paths shown or described as being single-ended may also be differential, and vice-versa. Similarly, signals described or depicted as having active-high or active-low logic levels may have opposite logic levels in alternative embodiments. Component circuitry within integrated circuit devices may be implemented using metal oxide semiconductor (MOS) technology, bipolar technology or any other technology in which logical and analog circuits may be implemented. With respect to terminology, a signal is said to be "asserted" when the signal is driven to a low or high logic state (or charged to a high logic state or discharged to a low logic state) to indicate a particular condition. Conversely, a signal is said to be "deasserted" to indicate that the signal is driven (or charged or discharged) to a state other than the asserted state (including a high or low logic state, or the floating state that may occur when the signal driving circuit is transitioned to a high impedance condition, such as an open drain or open collector condition). A signal driving circuit is said to "output" a signal to a signal receiving circuit when the signal driving circuit asserts (or deasserts, if explicitly stated or indicated by context) the signal on a signal line coupled between the signal driving and signal receiving circuits. A signal line is said to be "activated" when a signal is asserted on the signal line, and "deactivated" when the signal is deasserted. Additionally, the prefix symbol "/" attached to signal names indicates that the signal is an active low signal (i.e., the asserted state is a logic low state). A line over a signal name (e.g., '<signalname>') is also used to indicate an active low signal. The term "coupled" is used herein to express a direct connection as well as a connection through one or more intervening circuits or structures. Integrated circuit device "programming" may include, for example and without limitation, loading a control value into a register or other storage circuit within the device in response to a host instruction and thus controlling an operational aspect of the device, establishing a device configuration or controlling an operational aspect of the device through a one-time programming operation (e.g., blowing fuses within a configuration circuit during device production), and/or connecting one or more selected pins or other contact structures of the device to reference voltage lines (also referred to as strapping) to establish a particular device configuration or operation aspect of the device. The term "exemplary" is used to express an example, not a preference or requirement.

While has aspects of the disclosure have been described with reference to specific embodiments thereof, it will be evident that various modifications and changes may be made thereto without departing from the broader spirit and scope of the disclosure. For example, features or aspects of any of the embodiments may be applied, at least where practicable, in combination with any other of the embodiments or in place of counterpart features or aspects thereof. Accordingly, the specification and drawings are to be regarded in an illustrative rather than a restrictive sense.

We claim:

1. A chiplet-based multi-chip module (MCM) to couple to a base substrate, the chip let-based MCM comprising:
   a non-silicon package substrate that is separate from the base substrate;
   a first integrated circuit (IC) chiplet coupled to the non-silicon package substrate and comprising a first memory interface and a first network-on-chip (NoC) circuit;
   a first memory chiplet coupled to the non-silicon package substrate and comprising
      a first memory comprising a first memory space;
      a first port to communicate with the first memory interface of the first IC chiplet;
      a second port;
      a second NoC circuit in communication with the first NoC circuit via the first port, and coupled to the second port;
   a second memory chiplet arranged in a daisy-chained configuration with the first memory chiplet, the second memory chiplet comprising
      a second memory comprising a second memory space;
      a third port to communicate with the second port of the first memory chiplet;
      a third NoC circuit in communication with the first NoC circuit and the second NoC circuit; and wherein the first IC chiplet accesses the second memory space of the second memory chiplet via the first memory chiplet.

2. The chiplet-based MCM of claim 1, wherein:
   the first memory chiplet and the second memory chiplet comprise respective high bandwidth memory (HBM) chiplets.

3. The chiplet-based MCM of claim 1, wherein:
   the first memory comprises a first set of at least one memory IC die;
   the first port, the second port, and the second NoC circuit are formed on a first logic IC die that is coupled to the first set of at least one memory IC die;
   the second memory comprises a second set of at least one memory IC die; and
   the third port and the third NoC circuit are formed on a second logic IC die that is coupled to the second set of at least one memory IC die.

4. The chiplet-based MCM of claim 3, wherein:
   the first set of at least one memory IC die is disposed in a horizontal relationship with the first logic IC die; and
   the second set of at least one memory IC die is disposed in a horizontal relationship with the second logic IC die.

5. The chiplet-based MCM of claim 3, wherein:
   the first set of at least one memory IC die is disposed in a vertical relationship with the first logic IC die; and
   the second set of at least one memory IC die is disposed in a vertical relationship with the second logic IC die.

6. The chiplet-based MCM of claim 1, wherein the second NoC circuit includes:
   input buffer circuitry to receive information from the first NoC circuit; and
   a crossbar switch to feed the information from the input buffer circuitry to the second port.

7. The chiplet-based MCM of claim 1, wherein the first IC chiplet comprises:
   a first processing unit.

8. The chiplet-based MCM of claim 1, wherein:
   the second memory chiplet comprises a fourth port; and
   wherein the chiplet-based MCM further comprises a third memory chiplet coupled to the fourth port of the second memory chiplet; and
   wherein accesses to the third memory chiplet are carried out via the third port and fourth port of the second memory chiplet.

9. The chiplet-based MCM of claim 1, realized as a system-in-package (SiP).

10. The chiplet-based MCM of claim 9, wherein:
    the non-silicon package substrate comprises an organic standard package substrate.

11. The chiplet-based MCM of claim 10, wherein:
    the first memory chiplet comprises a first high-bandwidth memory (HBM) chiplet; and
    the second memory chiplet comprises a second high-bandwidth memory (HBM) chiplet.

12. A chiplet-based multi-chip module (MCM) to couple to a base substrate, the chiplet-based MCM comprising:
    a non-silicon package substrate that is separate from the base substrate;
    a first integrated circuit (IC) chiplet coupled to the non-silicon package substrate and comprising a first memory interface;

a first memory chiplet coupled to the non-silicon package substrate and comprising
  a first memory comprising a first memory space;
  a first port to communicate with the first memory interface of the first IC chiplet;
  a second port; and
a second memory chiplet coupled to the non-silicon package substrate and arranged inline with the first memory chiplet, the second memory chiplet comprising
  a second memory comprising a second memory space;
  a third port to communicate with the second port of the first memory chiplet; and
wherein the first IC chiplet to indirectly accesses the second memory space of the second memory chiplet via the first memory chiplet.

13. The chiplet-based MCM of claim 12, wherein the first IC chiplet comprises:
a first processing unit.

14. The chiplet-based MCM of claim 12, wherein:
the first memory comprises a first set of at least one memory IC die;
the first port and the second port are formed on a first logic IC die that is coupled to the first set of at least one memory IC die;
the second memory comprises a second set of at least one memory IC die; and
wherein the third port is formed on a second logic IC die that is coupled to the second set of at least one memory IC die.

15. The chiplet-based MCM of claim 14, wherein:
the first set of at least one memory IC die is disposed in a horizontal relationship with the first logic IC die; and
the second set of at least one memory IC die is disposed in a horizontal relationship with the second logic IC die.

16. The chiplet-based MCM of claim 15, wherein:
the first set of at least one memory IC die is disposed in a vertical relationship with the first logic IC die; and
the second set of at least one memory IC die is disposed in a vertical relationship with the second logic IC die.

17. The chiplet-based MCM of claim 12, wherein the first memory chiplet further comprises:
a fourth port coupled to the first memory space to communicate with a third IC chiplet.

18. The chiplet-based MCM of claim 17, wherein the third IC chiplet comprises:
a third memory chiplet.

19. The chiplet-based MCM of claim 12, realized as a system-in-package (SiP).

20. The chiplet-based MCM of claim 19, wherein:
the non-silicon package substrate comprises an organic standard package substrate.

21. The chiplet-based MCM of claim 20, wherein:
the first memory chiplet comprises a first high-bandwidth memory (HBM) chiplet; and
the second memory chiplet comprises a second high-bandwidth memory (HBM) chiplet.

* * * * *